United States Patent [19]

Fujihira

[11] Patent Number: 5,077,590
[45] Date of Patent: Dec. 31, 1991

[54] HIGH VOLTAGE SEMICONDUCTOR DEVICE

[75] Inventor: Tatsuhiko Fujihira, Matsumoto, Japan

[73] Assignee: Fuji Electric Co., Ltd., Japan

[21] Appl. No.: 551,399

[22] Filed: Jul. 12, 1990

[30] Foreign Application Priority Data

Jul. 12, 1989 [JP] Japan .................................. 1-179945
Feb. 21, 1990 [JP] Japan .................................. 2-40034

[51] Int. Cl.$^5$ ...................... H01L 29/06; H01L 29/90; H01L 29/68; H01L 27.02
[52] U.S. Cl. .................. 357/23.13; 357/13; 357/238; 357/20; 357/42
[58] Field of Search .................. 357/23.13, 13, 42, 20, 357/23.8

[56] References Cited

U.S. PATENT DOCUMENTS 4,920,445  4/1990  Jun ................................... 357/23.13

Primary Examiner—Rolf Hille
Assistant Examiner—Wael Fahmy
Attorney, Agent, or Firm—Brumbaugh, Graves, Donohue & Raymond

[57] ABSTRACT

The present invention relates to high voltage semiconductor devices with an integrated Zener diode used as a protective element against overvoltage. The Zener breakdown voltage can be increased while providing high operating voltage to the whole semiconductor device, by forming a region of lower impurity concentration around the cathode of the Zener diode. This lowers the current amplification factor of a parasitic transistor, enabling an increase in the Zener breakdown voltage without decreasing the withstand voltage of the whole semiconductor device.

6 Claims, 2 Drawing Sheets

HIGH VOLTAGE SEMICONDUCTOR DEVICE

BACKGROUND OF THE INVENTION

The present invention relates to high voltage semiconductor devices and particularly to high voltage semiconductor devices with an associated Zener diode capable of operating at higher voltages.

In high voltage semiconductor applications, elements such as a Zener diode are often integrated on one side of a semiconductor substrate on which a high voltage power semiconductor element having main electrodes on both faces is formed. A self-isolation type semiconductor device utilizes a p-n junction between the substrate region and the element region so that the element integrated on one face side of the semiconductor substrate is not affected by a voltage applied to the main electrode on another face side of the substrate.

FIG. 2 shows an example of a Zener diode portion of a self-isolation type semiconductor device. An n− bulk layer 3 is laminated on an n+ silicon substrate 1 on one face or side of the substrate, and an electrode 2 is adhered to the opposite side. A p− well 4 is formed selectively on the side of the substrate 1 of the n− layer 3. An n+ layer 5 is formed selectively on the side opposite to the substrate 1 of this p− well 4. This n+ layer 5 becomes the cathode region of the Zener diode, and the p− well 4 becomes the anode region thereof. A cathode electrode 8 is in contact with the n+ layer 5 at an opening of an insulating film 9. An anode electrode 7 is in contact with a p+ region 6 which surrounds the n+ region 5 and reaches the n− layer 3. By connecting the anode electrode 7 with an electrode of another integrated element and connecting the cathode electrode 8 with a terminal or still another integrated element, it is possible to have the Zener diode act as a protective element against an overvoltage. The high impurity concentration p+ regions 6 are useful as separating layers, and although they may be dispensed with, there is an effect to suppress the operation of parasitic elements produced between adjacent integrated elements.

FIG. 3 shows an example in which a bidirectional Zener diode is formed as a protective element against a bidirectional overvoltage. Two n+ cathode regions 5 are provided in the p− anode region 4, which are connected to other integrated elements or terminals by cathode electrodes 8. These two Zener diodes shown in FIG. 2 and FIG. 3 consisting of an anode region 4 and a cathode region 5 are separated from the rest of the semiconductor device by the p-n junction between n− layer 3 and the p− anode region 4 with respect to a positive voltage applied to the electrode 2.

When it is desired to increase the Zener breakdown voltage of the Zener diode shown in FIG. 2 or FIG. 3, the impurity concentration of the anode region 4 has to be lowered. However a parasitic bipolar transistor is formed by the n+ cathode layer 5 as an emitter, the p− well 4 as a base, and the n− bulk layer 3 and the n+ substrate 1 as a collector. When the concentration of the anode 4 is lowered, the d.c. current amplification factor $h_{FE}$ of this parasitic transistor increases. Therefore, the maximal voltage $V_{CEO}$ between the collector and the emitter is lowered. For example, $V_{CEO}$ is 90 to 95 V when the breakdown voltage of the Zener diode is at 5 V, and $V_{CEO}$ is at 80 to 85 V when the breakdown voltage is at 10 V. When the breakdown voltage is increased to 25 V, $V_{CEO}$ is lowered to 50 V. Since this $V_{CEO}$ determines the voltage applicable to the main electrode on the other side of the substrate, that is, the withstand or blocking voltage of this whole semiconductor device, the foregoing means that the withstand voltage of the whole semiconductor device is lowered as a result.

Objects of the present invention are to overcome such problems of the prior art and to provide a semiconductor device integrated with a Zener diode having a high breakdown voltage without lowering the withstand voltage of the whole semiconductor device.

SUMMARY OF THE INVENTION

In accordance with the present invention, there is described a high voltage semiconductor device in which a Zener diode composed of a first region of a second conductivity type exposed to a main surface on one side of a semiconductor substrate of a first conductivity type and a second region of a first conductivity type provided in the first region and exposed also to the main surface of one side is formed on the main surface on one side of the semiconductor substrate of the first conductivity type, characterized in that the portion of the second region which is in contact with the first region has a lower impurity concentration than the region which is farther than the first region.

For a better understanding of the present invention, together with other and further objects, reference is made to the following description, taken in conjunction with the accompanying drawings, and its scope will be pointed out in the appended claims.

DESCRIPTION OF THE PREFERRED EMBODIMENTS

Figure 1:
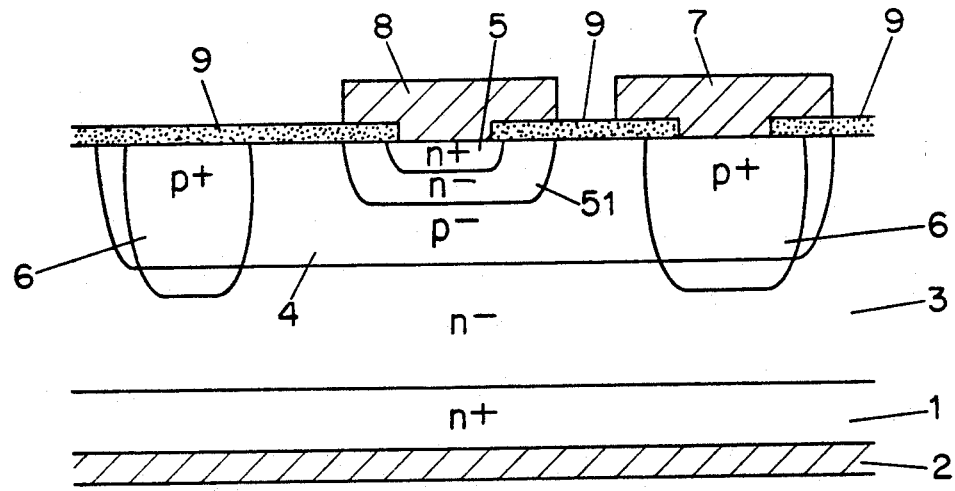
FIG. 1 is a sectional view of a Zener diode portion of a semiconductor device in accordance with the present invention.
Figure 2:
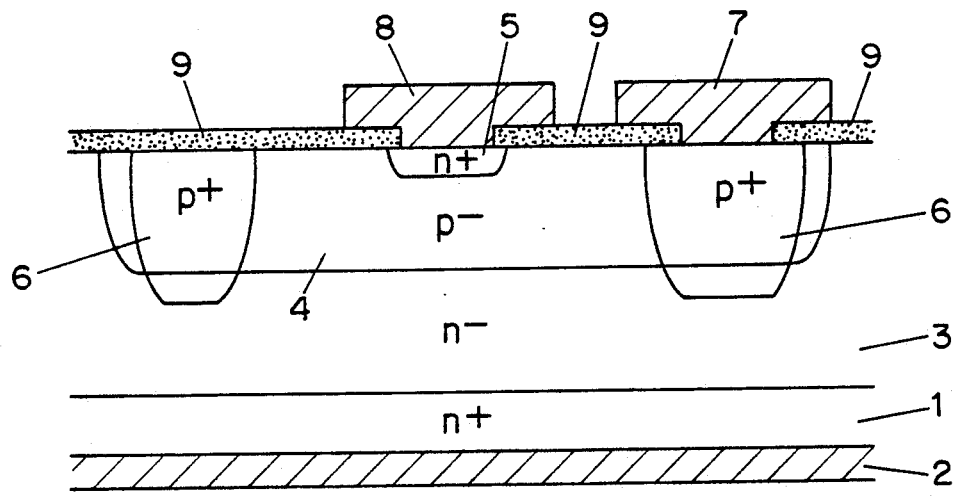
FIG. 2 is a sectional view of a Zener diode portion of a conventional semiconductor device.

FIG. 1 shows an embodiment of the present invention, in which those parts common with FIG. 2 are affixed with the same symbols. Similarly to FIG. 2, an n− layer 3 having an impurity concentration of approximately $10^{13}$ to $10^{16}/cm^3$ was laminated on an n+ layer 1. The anode region 4 was formed by ion implantation with a dose of approximately $1 \times 10^{13}/cm^3$ into this n− layer 3. The cathode region 5 was formed by ion implantation with a dose of approximately $5 \times 10^{15}/cm^3$. A third region 51 surrounding the cathode of impurity concentration lower than the cathode region was formed before the cathode region 5 by a dose of approximately $1 \times 10^{12}/cm^3$ to $3 \times 10^{12}/cm^3$. In addition to the above, a p+ separating region 6 of high impurity concentration was formed, as well as an electrode 2 in contact with the n+ substrate 1. An anode electrode 7 in contact with a p+ separating region 6 and a cathode electrode 8 in contact with the n+ cathode region 5 was formed, both through openings in an insulating film 9.

A parasitic bipolar transistor is formed with the cathode region as an emitter, with the anode region as a base, and with the remaining region of the semiconductor substrate as a collector. By making the portion of the cathode region which is in contact with the anode region have a low impurity concentration, the emitter side of the emitter base junction of the parasitic bipolar transistor is lowered in concentration, and $h_{FE}$ is also lowered. With this, $V_{CEO}$ of the parasitic bipolar transistor is lowered by a large margin, but the Zener breakdown voltage of the Zener diode which is determined by the impurity concentration of the anode region is lowered scarcely. This makes it possible to increase the Zener breakdown voltage and to provide a high voltage composite semiconductor device which is protected by the Zener diode having optimal breakdown voltage.

By forming a Zener diode in such a manner consisting of the p− anode region 4, the n− third region 51, and the n+ cathode layer 5, a value of 92 V was obtained as $V_{CEO}$ of the parasitic bipolar transistor with the n+ layer 5 and the n− layer 51 as an emitter, with the p− layer 4 as a base, and with the n− layer 3 and the n+ substrate 1 as a collector. This was irrespective of the Zener diode's breakdown voltage, constant at 25 V.

Figure 3:
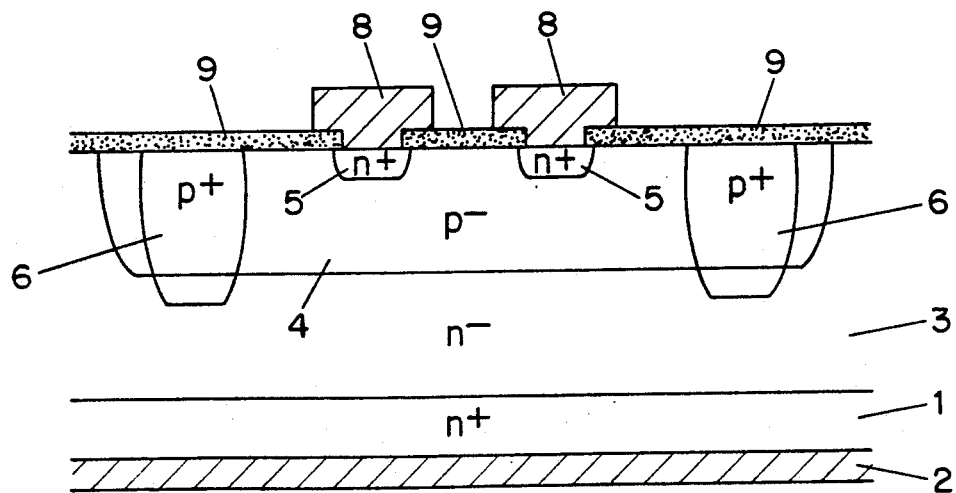
FIG. 3 is a sectional view of a bidirectional Zener diode portion of a conventional semiconductor device.
Figure 4:
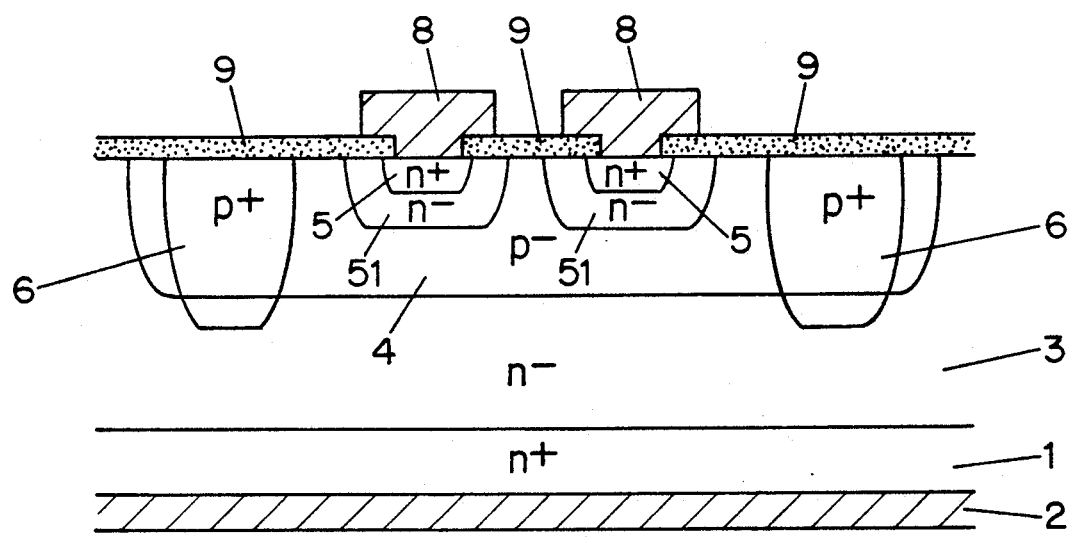
FIG. 4 is a sectional view of a bidirectional Zener diode portion of a semiconductor device in accordance with the present invention.

FIG. 4 shows another embodiment of the present invention in which a bidirectional Zener diode is formed in a similar manner as FIG. 3. Each of the cathode regions of the two Zener diodes, n+ regions 5, is surrounded by n− regions 51 of lower impurity concentration than the cathode regions. With this arrangement, the withstand voltage of the whole semiconductor was increased. When the withstand voltage required for respective Zener diodes are different from each other, however, the withstand voltage of the whole semiconductor can be increased by forming the cathode layer of only one of the Zener diodes in a double layer.

While there have been described what are believed to be the preferred embodiments of the invention, those skilled in the art will recognize that other and further modifications may be made thereto without departing from the invention, and it is intended to claim all such changes and modifications as fall within the scope of the invention.

I claim:

1. In a semiconductor device including a semiconductor substrate of a first conductivity type, wherein an associated Zener diode is used as a protective element against overvoltage, the combination comprising:
   an anode region of a second conductivity type formed at a surface region of said substrate;
   a cathode region of a first conductivity type provided at a surface region within said anode region, said cathode and anode regions having an impurity concentration effective to comprise a Zener diode of desired characteristics;
   and a third region of a first conductivity type surrounding said cathode region and having an impurity concentration lower than said cathode region;
   whereby, the current amplification factor of a parasitic bipolar transistor inherently introduced by the basic structure of the Zener diode formed by said cathode region as an emitter region, said anode region as a base region and said substrate as a collector region is primarily determined by said lower impurity concentration of said third region, and the breakdown voltage of the Zener diode is primarily determined by the impurity concentration of said cathode and anode regions, so that the maximum operating voltage of the device is improved.

2. A semiconductor device according to claim 1 in which the Zener diode includes:
   an anode electrode connected to said anode region;
   and a cathode electrode connected to said cathode region.

3. A semiconductor device according to claim 1 in which the Zener diode includes:
   one or more high impurity concentration regions of second conductivity type semiconductor material formed at the surface of the anode region surrounding the cathode region and coupled to the semiconductor substrate;
   an anode electrode connected to one said high impurity concentration region;
   and a cathode electrode connected to said cathode;
   whereby said one or more high impurity concentration regions suppress parasitic action between the Zener diode and elements adjacent to the Zener diode.

4. In a semiconductor device including a semiconductor substrate of a first conductivity type, wherein an associated bidirectional Zener diode is used as a protective element against a bidirectional overvoltage, the combination comprising:
   an anode region of a second conductivity type formed at a surface region of said substrate;
   two cathode regions of a first conductivity type provided at a surface region within said anode region, said cathode and anode regions having an impurity concentration effective to comprise a Zener diode of desired characteristics;
   and one or more third regions of a first conductivity type, each surrounding a cathode region and having an impurity concentration lower than said cathode regions;
   whereby, the current amplification factor of a parasitic bipolar transistor inherently introduced by the basic structure of the Zener diode formed by said cathode regions as an emitter region, said anode region as a base region and said substrate as a collector region is primarily determined by said lower impurity concentration of said third region, and the breakdown voltage of the Zener diode is primarily determined by the impurity concentration of said cathode and anode regions, so that the maximum operating voltage of the device is improved.

5. A semiconductor device according to claim 4 in which the Zener diode includes:
   a cathode electrode connected to each cathode region.

6. A semiconductor device according to claim 5 in which the Zener diode includes:
   one or more high impurity concentration regions of second conductivity type semiconductor material formed at the surface of the anode region surrounding the cathode regions and coupled to the semiconductor substrate;
   whereby said one or more high impurity concentration regions suppress parasitic action between the Zener diode and elements adjacent to the Zener diode.

* * * * *